United States Patent
Maige et al.

(10) Patent No.: US 6,590,353 B2
(45) Date of Patent: Jul. 8, 2003

(54) DEVICE FOR THE CONTROL OF A CIRCUIT FOR THE VERTICAL DEFLECTION OF A SPOT SCANNING A SCREEN

(75) Inventors: Philippe Maige, Seyssinet-Pariset (FR); Yannick Guedon, Sassenage (FR)

(73) Assignee: STMicroelectronics S.A., Montrouge (FR)

( * ) Notice: Subject to any disclaimer, the term of this patent is extended or adjusted under 35 U.S.C. 154(b) by 0 days.

(21) Appl. No.: 10/072,670

(22) Filed: Feb. 6, 2002

(65) Prior Publication Data

US 2002/0130246 A1 Sep. 19, 2002

(30) Foreign Application Priority Data

Feb. 7, 2001 (FR) .............................. 01 01839

(51) Int. Cl.[7] ................................ H01J 29/70
(52) U.S. Cl. ...................... 315/403; 315/397
(58) Field of Search ................ 315/403, 407, 315/396, 397, 395, 371, 291, 393, 408

(56) References Cited

U.S. PATENT DOCUMENTS 4,874,992 A * 10/1989 Benson et al. .............. 315/387
5,260,628 A * 11/1993 Kawaberi et al. ........... 315/371
6,151,082 A * 11/2000 Kim ............................ 348/806
6,411,048 B1 * 6/2002 Maige et al. ................ 315/403

FOREIGN PATENT DOCUMENTS

EP 1022855 A1 7/2000

OTHER PUBLICATIONS

French Preliminary Search report dated Jul. 3, 2001 for French Patent Application No. 0101839.

* cited by examiner

Primary Examiner—Don Wong
Assistant Examiner—Chuc D Tran
(74) Attorney, Agent, or Firm—Lisa K. Jorgenson; Jon A. Gibbons; Fleit, Kain, Gibbons, Gutman & Bongini P.L.

(57) ABSTRACT

Disclosed is a device to control a circuit for the vertical deflection of a spot scanning a screen, and more particularly a control device whose output amplifier stage works in class D mode at the rate of a switching signal called a first switching signal. The control device has an internal auxiliary supply to generate the overvoltage needed for the fast flyback of the spot. This auxiliary power supply is a switching voltage generation circuit whose switching signal, called a second switching signal, is synchronous with the first switching signal. The present invention has been shown to used advantageously in television screens and/or computer screens.

16 Claims, 3 Drawing Sheets

DEVICE FOR THE CONTROL OF A CIRCUIT FOR THE VERTICAL DEFLECTION OF A SPOT SCANNING A SCREEN

CROSS REFERENCE TO RELATED APPLICATIONS

This application is based upon and claims priority from prior French Patent Application No. 0101839, filed Feb. 7, 2001, the disclosure of which is hereby incorporated by reference in its entirety.

BACKGROUND OF THE INVENTION

1. Field of the Invention

The present invention generally relates to the field of devices for the control of a circuit for the deflection of a spot on a screen and more particularly the present invention relates to a circuit for the vertical deflection of a spot scanning on a screen, especially for television screens and computer screens using class D amplifiers.

2. Description of Related Art

Generally, the spot scans the screen in two orthogonal directions, typically a horizontal direction and a vertical direction. Horizontal or line scanning consists of shifting the spot from left to right and then making a line return at the end of the line to go to the next line. Simultaneously, in vertical scanning, the screen is scanned from top to bottom. When the spot reaches the bottom of the screen, a flyback is done to bring the spot to the top of the screen to begin the next scan. The vertical deflection of the spot therefore comprises an outbound or forward phase of vertical scanning (from top to bottom) and a phase for the fast flyback of the spot. This vertical deflection of the spot is preformed by placing the spot in a magnetic field created by one or more vertical deflection coils as part of a vertical deflection control circuit.

One device used in the control circuits for the vertical deflection of a spot scan on a screen is class AB (linear) or class D amplifiers. Class AB amplifiers are amplifiers whose output stage comprises transistors working in their linear zone and producing a quasi-DC voltage for this purpose. Class D amplifiers are amplifiers whose output stage comprises transistors working alternately in their saturation zone and in their cut-off zone so as to generate a "square-wave" voltage (an alternation of high and low levels). The high frequency components of this "square-wave" voltage are then filtered to obtain the mean value of the voltage.

The role of these amplifiers is to amplify an instructed-value signal, generally a sawtoothed signal, in order to deliver a vertical scanning control signal as shown in FIG. 1. The amplifier delivers a linear voltage ramp (the voltage decreases from $+V_M$ to $-V_M$) during the forward phase of the vertical scanning and delivers an overvoltage VF of several tens of volts (preferably 70 to 75 volts) during the spot flyback phase to ensure a fast spot flyback.

One control for a class D amplifier is described in a vertical deflection control circuit in the French patent application No. 9900715, with inventor Philippe Maige and commonly assigned with STMicroelectronics SA Société anonyme, and incorporated by reference in its entirety. FIGS. 2, 3 and 4 of the present invention are taken from the French patent application 9900715. FIG. 2 illustrate a diagram of the architecture of a vertical deflection circuit control device working as a class D device and FIGS. 3 and 4 illustrate two possible embodiments of the output stage of this device. Referring to FIG. 2, the reference control device DCS gives a vertical scanning signal to the vertical deflection circuit referenced DV. The control device DCS has a pre-amplification stage PMP mounted as an inverter, an output stage BLS, control means PWM and detection means DTF to control the output stage, and a smoothing filter F. The pre-amplification stage PMP consists of an operational amplifier AO mounted as an inverter whose inverter input is connected to the input terminal BE of the control device by means of a resistor R1. This inverter input is also connected to the output of the operational amplifier AO by means of a resistor R4 and secondly to a terminal BA of the vertical deflection circuit by means of a resistor R2. A low-value resistor R3 grounds the terminal BA. The resistors R1 and R4 fix the gain of the pre-amplification stage and the resistors R2 and R4 fix the gain of the feedback loop. A reference voltage Ref which may be zero, is applied to the non-inverter input of the operational amplifier.

The operational amplifier AO delivers an error signal which is used by the control means PWM and the detection means DTF to control the output stage BLS. Referring to FIG. 3, the output stage BLS comprises an amplifier stage ETS formed by two NMOS type transistors T1 and T2 series-connected between the node N1 and the negative terminal −Vcc of the main power supply of the control device. The common terminal of these two transistors is the output terminal BSS of the amplifier stage ETS. A diode D1 (D2 respectively) is mounted in an anti-parallel connection at the terminals of the transistor T1 (T2 respectively). That is, the anode of the diode D1 (D2 respectively) is connected to the source of the transistor T1 (T2 respectively) and the cathode of the diode D1 (D2 respectively) is connected to the drain of the transistor T1 (T2 respectively). The gates of the transistors T1 and T2 are controlled by opposite signals coming from the control means PWM. Hereinafter in the description, the control signal applied to the gate of the transistor T1 is called a switching signal $COM_{T1}$. The output terminal BSS of the amplifier stage ETS is connected to the output terminal BS of the control device by means of the smoothing filter F formed by an inductance coil and a capacitor.

The output stage BLS also has means MFB designed to control the generation of the overvoltage needed for the fast spot flyback. Referring to FIG. 3, the means MFB comprise a first two-way switch formed by an NMOS transistor T3 whose source is connected to the drain of the transistor T1 and whose drain is connected to a terminal BAL designed to receive a voltage VF delivered by an auxiliary power supply ALM. The means MFB also comprise a second two-way switch formed by an NMOS transistor T4 whose drain is connected to the drain of the transistor T1 and whose source is connected to the positive terminal +Vcc of the main power supply. A diode D3 (D4 respectively) is mounted in an anti-parallel connection at the terminals of the transistor T3 (T4 respectively). The transistors T3 and T4 are also controlled by the detection means DTF.

This control device works as follows. During the forward phase of vertical scanning, the control means PWM deliver control pulses (switching signal $COM_{T1}$) to make the transistors T1 and T2 alternately conductive and non-conductive with a very high switching frequency, in the range of 100 KHz. During this phase, the transistor T4 is conductive and the transistor T3 is off.

During this phase, the duration of the control pulses, designed to make the transistor T1 conductive, decreases from about 90% of the period of the switching signal to about 10% of the period of the switching signal. Conversely, the duration of the control pulses, designed to make the transistor T2 conductive, increases from about 10% of the period of the switching signal to about 90% of the period of the switching signal. The voltage at the terminal BSS is filtered by the filter F to keep only the mean value.

It is important to note that, when the output voltage of the control device is zero, the control pulses of the switching signal take up about 50% of the switching period.

During the fast flyback phase of the spot, the control means PWM respectively make the transistors T1 and T2 conductive and non-conductive and the detection means DTF respectively make the transistors T3 and T4 conductive and non-conductive. The voltage VF given by the auxiliary power supply ALM is then delivered to the output terminal BS of the control device.

At present, the auxiliary power supply ALM used to generate the overvoltage is either external, i.e., external to the control device or internal, i.e., integrated into the control device. In the former case corresponding to the case shown in FIG. 3, the auxiliary power supply is generally a voltage step-up converter which, from a power supply voltage of about 24 volts, gives an auxiliary power supply voltage of about 70 volts. This approach is very satisfactory because the control device requires the presence of an external auxiliary supply in order to function.

The case of an auxiliary supply known as an internal supply is illustrated in FIG. 4. The internal auxiliary supply is formed by a chemical capacitor C whose first terminal is connected for example to the positive terminal +Vcc of the main power supply by means of the first two-way switch T4 and to the drain of the transistor T1. The second switch T3 is then used to connect the second terminal of the capacitor to the positive terminal +Vcc of the main power supply. The second terminal of the capacitor is also connected to the negative terminal −Vcc of the main power supply by means of a third two-way switch T6. The capacitor C is then charged by the main power supply voltage during the forward phase of the vertical scanning and is placed in series with the positive terminal of the main power supply during the fast spot flyback phase to generate the overvoltage. In this circuit, the voltage values of the main supply and of the auxiliary supply are correlated. This approach although useful, is not without its drawbacks. One drawback is that the voltage generated by this internal circuit is not sufficient. Typically the voltage generated is in the range of 36 V for a main power supply of 24 V. One solution to this drawback consists of increasing the value of the main power supply voltage. However, this approach of increased power supply voltage has its drawbacks. For example one drawback is it requires an increase in the heat dissipation in the control device. This goes against the goal desired through the use of class D amplifiers. Accordingly, a need exists to provide an auxiliary power supply to overcome these shortcomings for the control of vertical deflection circuits.

SUMMARY OF THE INVENTION

The present invention results from research carried out on devices for the control of vertical deflection circuits with an output stage working. The present invention has been shown to be used advantageously with an output stage working in class D mode. Moreover, the present invention provides a control device that does not require any auxiliary external power supply and is capable of producing a high voltage value in the range of 70 to 75 volts without disturbing the small-signal operation of the amplifier of the control device, especially during the forward scanning stage.

The present invention is a device to control a circuit for the vertical deflection of a spot scanning a screen, comprising an output amplifier stage powered by a main power supply for the vertical scanning control and an auxiliary power supply capable of generating an overvoltage at the vertical deflection circuit for the fast flyback of the spot, the output amplifier stage working in class D mode at the rate of a switching signal called the first switching signal, the auxiliary power supply being also internal to the control device, wherein the auxiliary power supply is a switching voltage generation circuit whose switching signal, called a second switching signal, is synchronous with the first switching signal.

According to a particular embodiment, the switching voltage generation circuit comprises an output terminal to deliver the overvoltage, an inductive element series-mounted with a switch between a first terminal of the main power supply and a second terminal of the main power supply, a capacitive element connected between the output terminal and the second terminal of the main power supply, a diode whose anode is connected to an intermediate point between the inductive element and the switch and whose cathode is connected to the output terminal and a switch control circuit to deliver the second switching signal designed to control the state of the switch, the second switching signal being synchronous with the first switching signal.

In this embodiment for example, the switch control circuit is preferably a DC/DC regulator receiving at input a reference voltage signal, a signal representing the voltage present at the output terminal of the switching voltage generating circuit, a clock signal synchronous with the first switching signal and a ramp signal used to modulate the duration of the control pulses of the second switching signal.

BRIEF DESCRIPTION OF THE DRAWINGS

The subject matter which is regarded as the invention is particularly pointed out and distinctly claimed in the claims at the conclusion of the specification. The foregoing and other features, and advantages of the invention will be apparent from the following detailed description taken in conjunction with the accompanying drawings.

DETAILED DESCRIPTION OF AN EMBODIMENT

Figure 1:
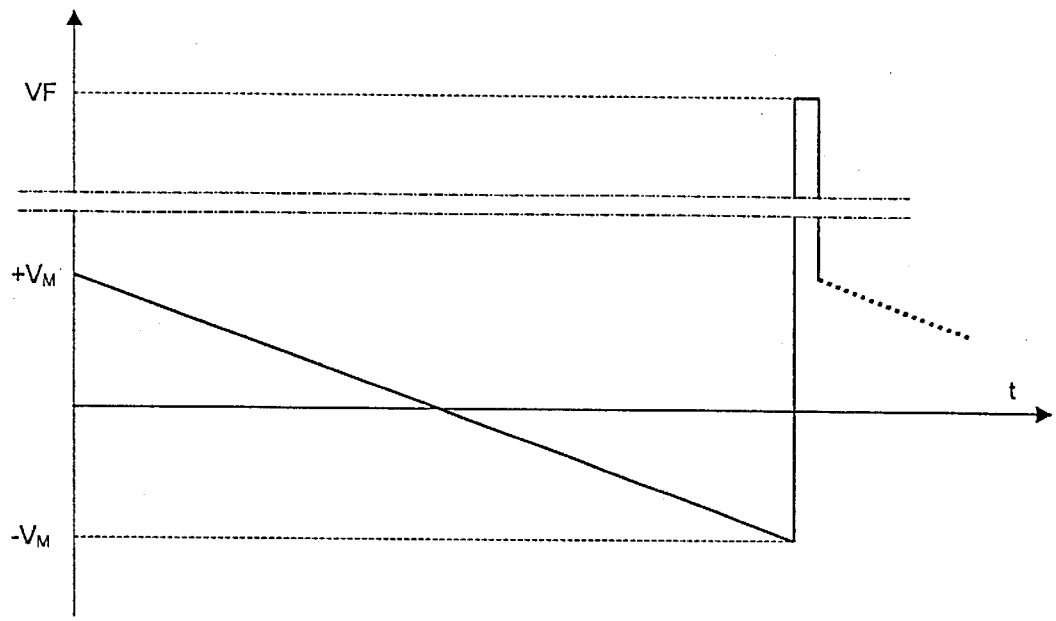
FIG. 1, already described, represents the vertical scanning control signal delivered by a vertical deflection control device.
Figure 2:
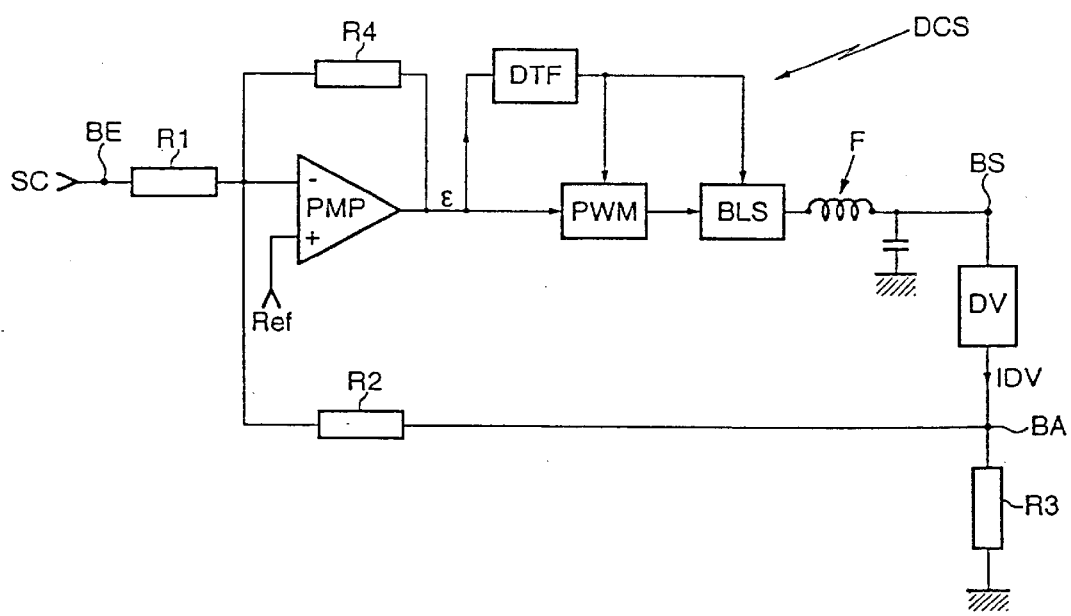
FIG. 2, already described, represents the drawing of a prior art control device for creating the vertical scanning control signal of FIG. 1.
Figure 3:
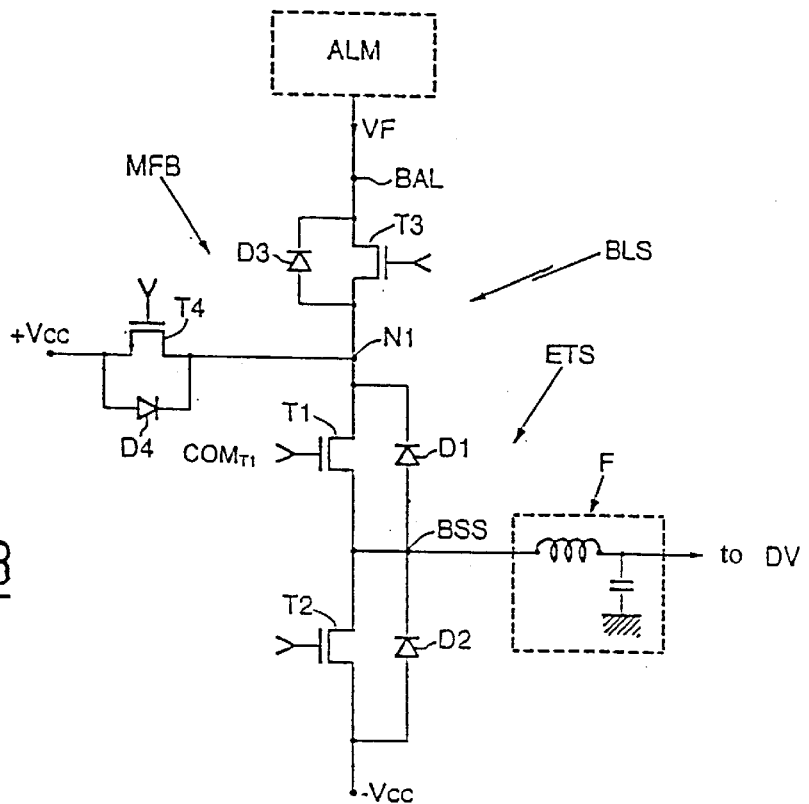
FIGS. 3 and 4, already described, represent two different embodiments of the output stage of the control device of FIG. 2.
Figure 4:
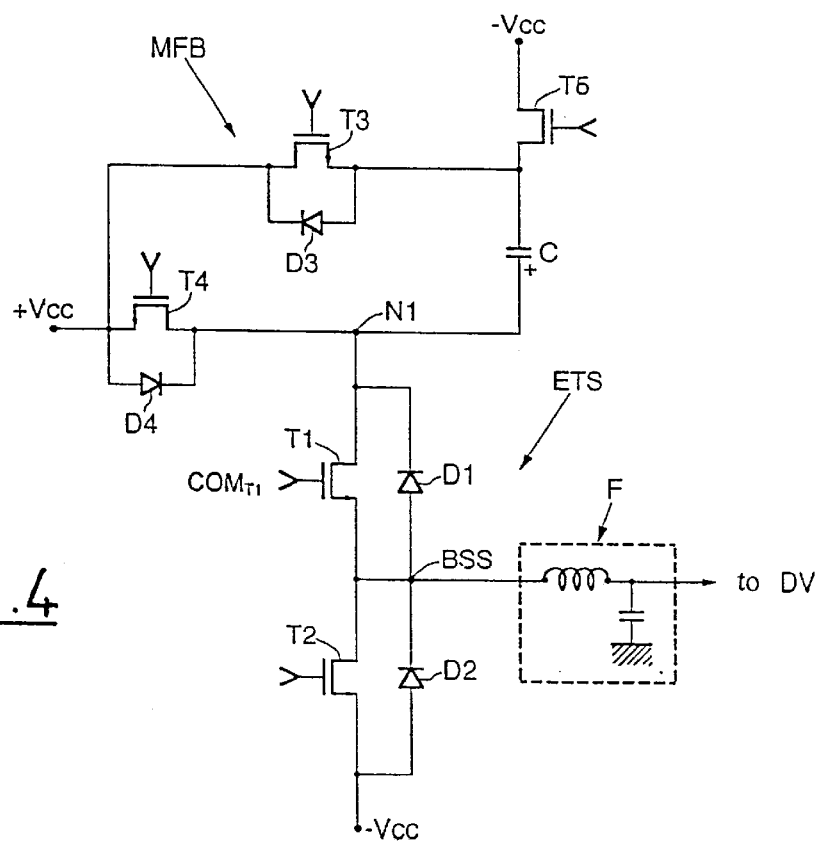

It should be understood that these embodiments are only examples of the many advantageous uses of the innovative teachings herein. In general, statements made in the specification of the present application do not necessarily limit any of the various claimed inventions. Moreover, some statements may apply to some inventive features but not to others. In general, unless otherwise indicated, singular elements maybe in the plural and vice versa with no loss of generality.

In the drawing like numerals refer to like parts through several views.

The invention provides for the integration into the control device of a switching voltage generation circuit that generates the overvoltage from voltage given by the main power supply of the control device. In one embodiment, the switching signal of the switching voltage generation circuit and the switching signal $COM_{T1}$ of the output amplifier stage BLS are synchronous so that the switching signal of the switching voltage generation circuit does not disturb the working of the output amplifier stage ETS and vice versa.

Figure 5:
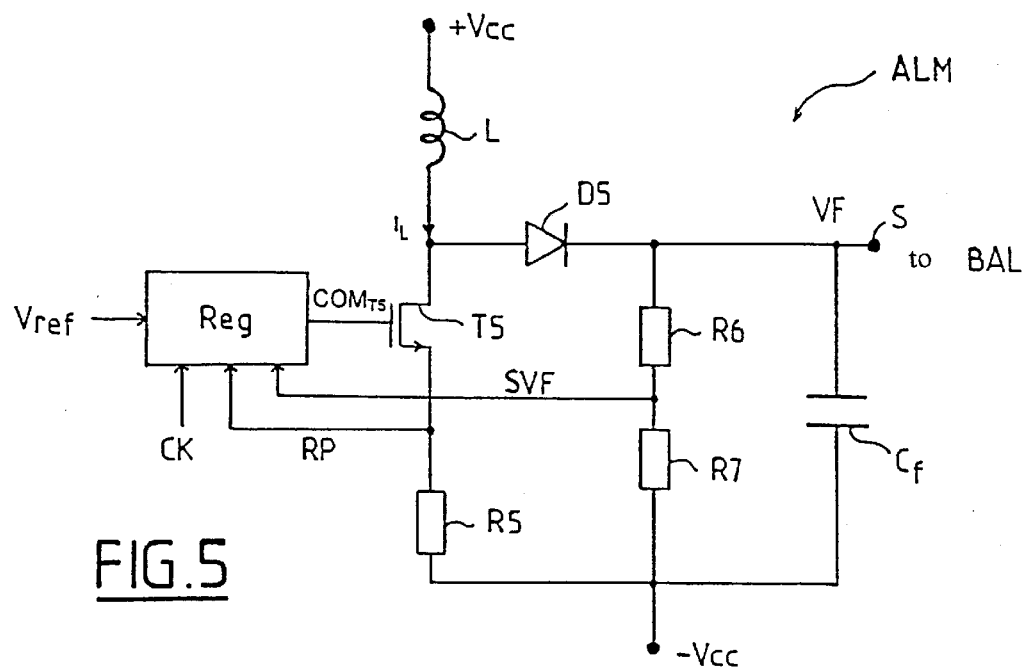
FIG. 5 is a drawing of a switching voltage generation circuit capable of generating a overvoltage, which is integrated into the control device, according to the present invention.

A possible structure of the switching voltage generation circuit ALM is shown in FIG. 5. This device ALM is integrated into the control device DCS. In the present case, it is a voltage step-up converter. It comprises an inductance coil L, a first terminal of which is connected to the positive terminal +Vcc of the main power supply of the control device, and the second terminal of which is connected to the first terminal of a resistor R5 by means of a switch herein formed by a NMOS type transistor T5. The drain of the transistor T5 is connected to the second terminal of the inductance coil L and its source is connected to the first resistor R5. The second terminal of the resistor R5 is connected to the negative terminal −Vcc of the main power supply. The voltage generation device ALM furthermore comprises a diode D5 whose anode is connected to the second terminal of the inductance coil L and whose cathode is connected to an output terminal S. A capacitor Cf is connected between the output terminal S and the negative terminal −Vcc of the main power supply. During the forward phase of vertical scanning, this capacitor is charged with the current coming from the inductance coil L so as to reach an overvoltage value VF of about 70 volts.

To control the transistor T5 and regulate the voltage at the output terminal S of the device ALM, a DC/DC regulator referenced Reg is provided. This regulator delivers a switching signal $COM_{T5}$ to control the state of conduction of the transistor T5. The switching signal $COM_{T5}$ is given to the gate of the transistor T5. In the example shown in FIG. 5, the architecture of the regulator is that of the regulator UC3842 commercially distributed inter alia by the firm ST Microelectronics. The regulator Reg receives a reference DC voltage signal Vref at input, a signal SVF representing the value of the voltage VF at the output terminal S, a clock signal CK and a ramp signal RP. The signal SVF herein corresponds to a voltage at the midpoint of a divider bridge formed by two resistors R6 and R7 series-mounted between the output terminal S and the negative terminal −Vcc of the main supply. The ramp signal RP is the voltage signal present at the source of the transistor T5, the resistor R5 herein playing a role of a current/voltage converter. Thus, the regulator Reg generates a control pulse at each pulse of the clock signal and the duration of this control pulse is modulated as a function of the value of the signals SVF and RP.

The working of a switching voltage generation circuit such as this is well known to those skilled in the art. This device works in such a way that, when the transistor T5 is conductive, the inductance coil L stores the energy and the current $i_L$ flowing through it increases and when the transistor T5 is off, the inductance coil L restores the stored energy and the capacitor Cf gets charged.

Figure 6:
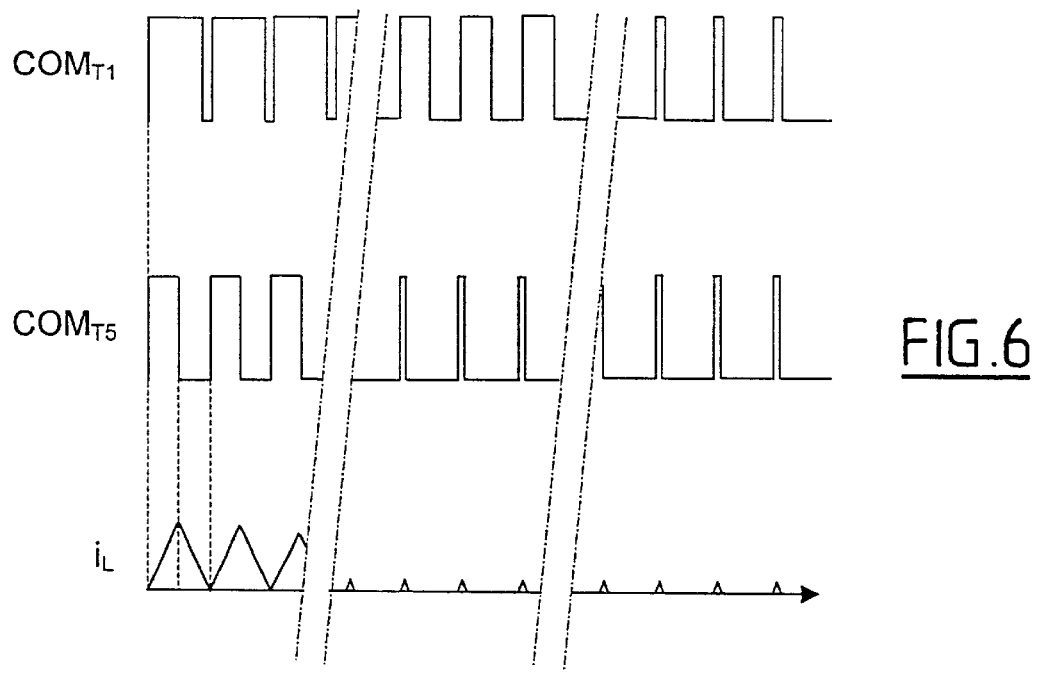
FIG. 6 is an waveform timing illustration of the switching signals of the amplifier of the control device and of the switching voltage generation circuit as well as the form of the current in the inductive coil of the switching voltage generation circuit during the forward stage of vertical scanning, according to the present invention.

We shall now give a more detailed description of the working of this voltage generation device as compared with that of the control device of the invention with reference more particularly to FIGS. 5 and 6. FIG. 6 shows a waveform of the signals $COM_{T1}$, $COM_{T5}$ and $i_L$ at the beginning, middle and end of the forward phase of vertical scanning. These three periods of the forward phase of vertical scanning are separated in the figure by thin lines of dots and dashes.

During the vertical scanning forward phase, the capacitor Cf gets charged. As shown in FIG. 5, as and when the capacitor Cf gets charged, the demand for current by this capacitor diminishes and the cyclical ratio of the switching signal $COM_{T5}$ then diminishes. The leading edges of the switching signal $COM_{T5}$ and of the switching signal $COM_{T1}$ are synchronous. Advantageously, the capacitor Cf gets charged during the first half of the vertical scanning forward phase until it reaches the value VF and this charge is held in the capacitor during the second half of this vertical scanning forward phase. The cyclical ratio of the switching signal $COM_{T5}$ is therefore very low during this second half of the stage and is just enough to compensate for the Joule's heat losses in the resistive divider bridge.

Preferably, it is seen to it that the duration of each control pulse of the switching signal $COM_{T5}$ is lower than that of the corresponding control pulse of the switching signal $COM_{T1}$ so that the trailing edges of the switching signal $COM_{T5}$ do not disturb the working of the output amplifier stage ETS of the control device DCS.

During the fast flyback phase of the spot, the switching signal $COM_{T1}$ remains at a high level while the switching signal $COM_{T5}$ remains at the low level.

It must be noted that this could also be integrated into an AB class control device.

Although a specific embodiment of the invention has been disclosed, it will be understood by those having skill in the art that changes can be made to this specific embodiment without departing from the spirit and scope of the invention. The scope of the invention is not to be restricted, therefore, to the specific embodiment, and it is intended that the appended claims cover any and all such applications, modifications, and embodiments within the scope of the present invention.

What is claimed is:

1. A device to control a circuit for the vertical deflection of a spot scanning a screen, the device comprising:
   an output amplifier stage receiving power from a main power supply for the vertical scanning control; and
   an auxiliary power supply for generating an overvoltage at the vertical deflection circuit for the fast flyback of the spot;
   wherein the output amplifier stage operates at a rate of a switching signal called a first switching signal;
   wherein the auxiliary power supply is a switching voltage generation circuit whose switching signal, called a second switching signal, is synchronous with the first switching signal.

2. The device according to claim 1, wherein the output amplifier is working in a class D mode.

3. The device according to claim 1, wherein the auxiliary power supply includes a switching voltage generation circuit comprising:
   an output terminal to deliver the over voltage;
   an inductive element series-mounted with a switch between a first terminal of the main power supply and a second terminal of the main power supply;
   a capacitive element connected between the output terminal and the second terminal of the main power supply; and
   a diode whose anode is connected to an intermediate point between the inductive element and the switch and whose cathode is connected to the output terminal and a switch control circuit to deliver the second switching signal designed to control the state of the switch, the second switching signal being synchronous with the first switching signal.

4. The device according to claim 3, wherein the switch is an NMOS type transistor.

5. The device according to claim 3, wherein the switch control circuit further comprises a DC/DC regulator having:
   a reference voltage input terminal for receiving a reference voltage signal;
   a clock input terminal for receiving clock signal synchronous with the first switching signal;
   a ramp input terminal for receiving a ramp signal;
   an input terminal for receiving a signal representing the voltage present at the output terminal of the switching voltage generating circuit; and
   an output terminal for providing the second switching signal.

6. The device according to claim 4, wherein the switch control circuit further comprises a DC/DC regulator:
   a reference voltage input terminal for receiving a reference voltage signal;
   a clock input terminal for receiving clock signal synchronous with the first switching signal;
   a ramp input terminal for receiving a ramp signal;
   an input terminal for receiving a signal representing the voltage present at the output terminal of the switching voltage generating circuit; and
   an output terminal for providing the second switching signal.

7. The device according to claim 5, wherein the switching voltage generation circuit comprises:
   a resistive divider bridge formed by two resistors series-connected between the output terminal and the second terminal of the main power supply;
   wherein the signal representing the voltage present at the output terminal of the switching voltage generation circuit corresponds to a voltage at a midpoint of the resistive divider bridge.

8. The device according to claim 6, wherein the switching voltage generation circuit comprises:
   a resistive divider bridge formed by two resistors series-connected between the output terminal and the second terminal of the main power supply;
   wherein the signal representing the voltage present at the output terminal of the switching voltage generation circuit corresponds to the voltage at the midpoint of the resistive divider bridge.

9. The device according to claim 3, wherein the first and second switching signals both have control pulses, wherein the leading edges of the control pulses of the second switching signal are synchronous with the leading edges of the control pulses of the first switching signal and wherein each control pulse of the second switching signal has a duration smaller than the duration of the corresponding control pulse of the first switching signal.

10. The device according to claim 7, wherein the first and second switching signals both have control pulses, wherein the leading edges of the control pulses of the second switching signal are synchronous with the leading edges of the control pulses of the first switching signal and wherein each control pulse of the second switching signal has a duration smaller than the duration of the corresponding control pulse of the first switching signal.

11. A device to control a circuit for the deflection of a spot scanning a screen, the device comprising:

an output amplifier stage receiving power from a main power supply for the scanning control, the output amplifier stage operating at a rate of a switching signal called a first switching signal; and an auxiliary power supply formed from a switching voltage generation circuit for generating an over voltage at the deflection circuit for the fast flyback of the spot, the switching voltage generation circuit comprising:
   a second switching signal which is synchronous with the first switching signal;
   an output terminal to deliver the over voltage;
   an inductive element series-mounted with a switch between a first terminal of the main power supply and a second terminal of the main power supply;
   a capacitive element connected between the output terminal and the second terminal of the main power supply; and
   a diode whose anode is connected to an intermediate point between the inductive element and the switch and whose cathode is connected to the output terminal and a switch control circuit to deliver the second switching signal designed to control the state of the switch, the second switching signal being synchronous with the first switching signal.

12. The device according to claim 11, wherein the switch is an NMOS type transistor.

13. The device according to claim 11, wherein the output amplifier is working in a class D mode as part of a class D amplifier.

14. The device according to claim 11, wherein the switch control circuit further comprises a DC/DC regulator having:
   a reference voltage input terminal for receiving a reference voltage signal;
   a clock input terminal for receiving clock signal synchronous with the first switching signal;
   a ramp input terminal for receiving a ramp signal;
   an input terminal for receiving a signal representing the voltage present at the output terminal of the switching voltage generating circuit; and
   an output terminal for providing said second switching signal.

15. The device according to claim 13, wherein the switch control circuit is preferably a DC/DC regulator receiving:
   a reference voltage input terminal for receiving a reference voltage signal;
   a clock input terminal for receiving clock signal synchronous with the first switching signal;
   a ramp input terminal for receiving a ramp signal; and
   an input terminal for receiving a signal representing the voltage present at the output terminal of the switching voltage generating circuit; and
   an output terminal for providing said second switching signal.

16. The device according to claim 15, wherein the switching voltage generation circuit comprises:
   a resistive divider bridge formed by two resistors series-connected between the output terminal and the second terminal of the main power supply;
   wherein the signal representing the voltage present at the output terminal of the switching voltage generation circuit corresponds to the voltage at the midpoint of the resistive divider bridge.

* * * * *